(12) United States Patent
Willson et al.

(10) Patent No.: US 10,239,982 B2
(45) Date of Patent: Mar. 26, 2019

(54) BLOCK POLYMERS FOR SUB-10 NM PATTERNING

(71) Applicant: Board of Regents The University of Texas System, Austin, TX (US)

(72) Inventors: Carlton Grant Willson, Austin, TX (US); Gregory Blachut, Austin, TX (US); Michael Maher, Austin, TX (US); Yusuke Asano, Austin, TX (US); Christopher John Ellison, Austin, TX (US)

(73) Assignee: Board of Regents The University of Texas System, Austin, TX (US)

( * ) Notice: Subject to any disclaimer, the term of this patent is extended or adjusted under 35 U.S.C. 154(b) by 66 days.

(21) Appl. No.: 15/439,604

(22) Filed: Feb. 22, 2017

(65) Prior Publication Data

US 2017/0240681 A1    Aug. 24, 2017

Related U.S. Application Data

(60) Provisional application No. 62/298,628, filed on Feb. 23, 2016.

(51) Int. Cl.
| | | |
|---|---|---|
| C08F 297/00 | (2006.01) |
| B32B 5/16 | (2006.01) |
| B05D 3/10 | (2006.01) |
| B05D 7/26 | (2006.01) |
| B05D 7/00 | (2006.01) |
| C09D 153/00 | (2006.01) |
| G03F 7/00 | (2006.01) |
| H01L 21/027 | (2006.01) |
| B82Y 40/00 | (2011.01) |

(52) U.S. Cl.
CPC ............ C08F 297/00 (2013.01); B05D 3/108 (2013.01); B05D 7/26 (2013.01); B05D 7/542 (2013.01); C09D 153/00 (2013.01); G03F 7/0002 (2013.01); H01L 21/0271 (2013.01); B81C 2201/0149 (2013.01); B82Y 40/00 (2013.01)

(58) Field of Classification Search
USPC ................................................. 428/402, 403
See application file for complete search history.

(56) References Cited

U.S. PATENT DOCUMENTS

| | | | |
|---|---|---|---|
| 2013/0029113 A1 | 1/2013 | Nealey et al. | ............. 428/195.1 |
| 2015/0099109 A1 | 4/2015 | Gopalan et al. | ............. 428/500 |

OTHER PUBLICATIONS

Trumbo, Copolymerization of 5-vinyl-1,3-benzodioxole with n-butyl acrylate and methyl methacrylate, Polymer Bulletin 24, 3850389 (1990) (Year: 1990).*

Maher et al., Directed self-assembly of silicon-containing block copolymer thin films, ACS Appl. Mater. Interfaces 2015, 7, 3323-3328 (Year: 2015).*

Kim et al., High-x block copolymers with high etch selectivity for sub-10 nm patterning, Oct. 2017 (Year: 2017).*

(Continued)

*Primary Examiner* — Hoa (Holly) Le

(74) *Attorney, Agent, or Firm* — Medlen & Carroll, LLP

(57) ABSTRACT

The present invention relates to a method for the synthesis and utilization of block copolymer can that form sub-10 nm lamella nanostructures. Such methods have many uses including multiple applications in the semiconductor industry including production of templates for nanoimprint lithography.

11 Claims, 13 Drawing Sheets

(56) References Cited

OTHER PUBLICATIONS

Lane et al., Directed self-assembly and pattern transfer of five nanometer block copolymer lamellae, ACS Nano 2017, 11, 7656-7665 (Year: 2017).*
Durand, W. J. et al. (2015) "Design of high-$\chi$ block copolymers for lithography," *Journal of Polymer Science Part A: Polymer Chemistry* 53(2), 344-352.
Kim, S. et al. (2013) "Consequences of Surface Neutralization in Diblock Copolymer Thin Films," *ACS Nano* 7(11), 9905-9919.
Mansky, P. et al. (1997) "Controlling Polymer-Surface Interactions with Random Copolymer Brushes," *Science* 275(7), 1454-1457.
Seidel, R. et al. (2015) "6—Directed self-oriented self-assembly of block copolymers using chemically modified surfaces," in *Directed Self-assembly of Block Co-polymers for Nano-manufacturing* (Gronheid, R., et al., Eds.), pp. 129-170, Woodhead Publishing.

* cited by examiner

BLOCK POLYMERS FOR SUB-10 NM PATTERNING

CROSS-REFERENCE TO RELATED APPLICATIONS

The present application claims the benefit of U.S. Provisional Patent Application No. 62/298,628, filed on Feb. 23, 2016, which is incorporated herein by reference.

FIELD OF THE INVENTION

The present invention relates to block copolymers that can form sub-10 nm lamella nanostructures. Such compositions have many uses including multiple applications in the semiconductor industry including production of templates for nanoimprint lithography.

BACKGROUND OF THE INVENTION

The semiconductor and the hard disk drive manufacturers are in desperate need of efficient methods to pattern structures in 10 nm regime and below. There is a continued need for such structures in various fields, including nanomanufacturing. What is needed are compositions and methods that generate well-formed lamella structures that can be used to produce patterns that are 10 nm and below in width that are useful for manufacturing advanced devices.

SUMMARY OF THE INVENTION

The present invention relates to block copolymers that can form sub-10 nm lamella nanostructures. Such compositions have many uses including multiple applications in the semiconductor industry including production of templates for nanoimprint lithography.

This material provides among the very smallest patterns that can be successfully transferred into a substrate for engineering use. A block copolymer comprising a unique monomer together with a monomer containing silicon that generates well-formed lamella structures that can be used to produce patterns that are 10nm and below in width that are useful for manufacturing advanced devices. Block copolymers are described herein that forms among the smallest lamella structures known that can be transferred by reactive ion etching.

In one embodiment, the invention relates to a block copolymer comprising 5-vinylbenzo[d][1,3]dioxole. In one embodiment, said block copolymer is part of a layered structure. In one embodiment, said block copolymer further comprises a silicon-containing block. In one embodiment, block copolymer further comprises pentamethyldisilylstyrene. In one embodiment, said block copolymer is poly(5-vinylbenzo[d][1,3]dioxole)-b-poly(pentamethyldisilylstyrene).

In one embodiment, the invention relates to a method to achieve sub-10 nm nanostructures, comprising a) coating a block copolymer film on a substrate, said block copolymer comprising 5-vinylbenzo[d][1,3]dioxole; b) applying a top coat on top of the block copolymer, and c) annealing under conditions such that sub-10 nm nanostructures form. In one embodiment, the surface of said substrate is treated to be neutral or near neutral prior to said coating of step a). In one embodiment, the surface of said substrate is naturally neutral or near neutral. In one embodiment, said nanostructures are lamella nanostructures. In one embodiment, said nanostructures are cylindrical nanostructures. In one embodiment, said method further comprises d) etching said layered structure to remove the top coat and part of the block copolymer revealing said nanostructures.

In one embodiment, the invention relates to a method of creating a layered structure, comprising: a) providing a surface, a surface treatment layer, a block copolymer comprising 5-vinylbenzo[d][1,3]dioxole, and a top coat composition; b) treating said surface with said surface treatment layer to create a first layer on said surface; c) coating said first layer with block copolymer to create a second layer on said surface comprising a block copolymer film; and d) coating said second layer with said top coat composition so as to create a third layer on said surface, said third layer comprising a top coat on said block copolymer film surface, said first, second and third layers comprising a layered structure.

In one embodiment, the invention relates to sub-10 nm nanostructures (i.e. structures smaller than 10 nanometers, and preferably structures smaller than 5 nanometers, but greater than 1 nanometer) comprising a block copolymer comprising 5-vinylbenzo [d][1,3]dioxole.

Definitions

To facilitate the understanding of this invention, a number of terms are defined below. Terms defined herein have meanings as commonly understood by a person of ordinary skill in the areas relevant to the present invention. Terms such as "a", "an" and "the" are not intended to refer to only a singular entity, but include the general class of which a specific example may be used for illustration. The terminology herein is used to describe specific embodiments of the invention, but their usage does not delimit the invention, except as outlined in the claims.

In addition, atoms making up the compounds of the present invention are intended to include all isotopic forms of such atoms. Isotopes, as used herein, include those atoms having the same atomic number but different mass numbers. By way of general example and without limitation, isotopes of hydrogen include tritium and deuterium, and isotopes of carbon include $^{13}C$ and $^{14}C$. Similarly, it is contemplated that one or more carbon atom(s) of a compound of the present invention may be replaced by a silicon atom(s). Furthermore, it is contemplated that one or more oxygen atom(s) of a compound of the present invention may be replaced by a sulfur or selenium atom(s).

It is desired that the block copolymer film deposited over the first film develop "physical features on a nanometer scale," "nanofeatures" or "nanostructures" with controlled orientation. These physical features have shapes and thicknesses. For example, various structures can be formed by components of a block copolymer, such as vertical lamellae, in-plane cylinders, and vertical cylinders, and may depend on surface energies and film thickness. In one embodiment, the second film develops cylindrical nanostructures, said cylindrical structures being substantially vertically aligned with respect to the plane of the first film. Orientation of structures in regions or domains at the nanometer level (i.e. "microdomains" or "nanodomains") may be controlled to be approximately uniform. The methods described herein can generate structures with the desired size, shape, orientation, and periodicity. Thereafter, in one embodiment, these nanostructures may be etched or otherwise further treated.

BRIEF DESCRIPTION OF THE DRAWINGS

The accompanying figures, which are incorporated into and form a part of the specification, illustrate several embodiments of the present invention and, together with the description, serve to explain the principles of the invention. The figures are only for the purpose of illustrating a preferred embodiment of the invention and are not to be construed as limiting the invention.

DETAILED DESCRIPTION OF THE INVENTION

In one embodiment, the invention relates to copolymers containing 5-vinylbenzo[d][1,3]dioxole and pentamethyldisilylstyrene and related structures. Poly(5-vinylbenzo[d][1,3]dioxole)-b-poly(pentamethyldisilylstyrene) is a an example diblock copolymer of this type. This block copolymer can form sub-10 nm lamella nanostructures, which can be useful in a variety of applications. For example, this material can form 5 nm line/spaces, which can be used for patterning advanced microelectronic devices.

It is believed that innovations of the current invention include that this material can form sub-10 nm lamella features, and the silicon-containing block imparts inherent etch contrast. Therefore, it solves two problems simultaneously. It can 1) access features in the sub-10 nm regime and 2) it displays etch resistance so that a 3-dimensional topographical pattern can be achieved. Because of the etch resistance, this material is significantly more valuable than other block copolymers that can form sub-10 nm features. The etch contrast enables pattern transfer, which is required for in microelectronic device manufacturing.

This material has the ability to form 5 nm or less nanostructures, which can be useful in patterning applications such as lithography. Access to 5 nm features is incredibly challenging and is not possible using the current state-of-the-art manufacturing processes.

The current block copolymer that is the closest to commercialization is poly(styrene-block-methylmethacrylate) (PS-PMMA). PS-PMMA cannot access sub-10 nm features and has relatively low etch contrast compared to silicon-containing polymers. Poly(5-vinylbenzo [d][1,3]dioxole)-b-poly(pentamethyldisilylstyrene) can form sub-10 nm features and has enough etch contrast to enable pattern dimensions on the 5 nm length scale.

Figure 4:
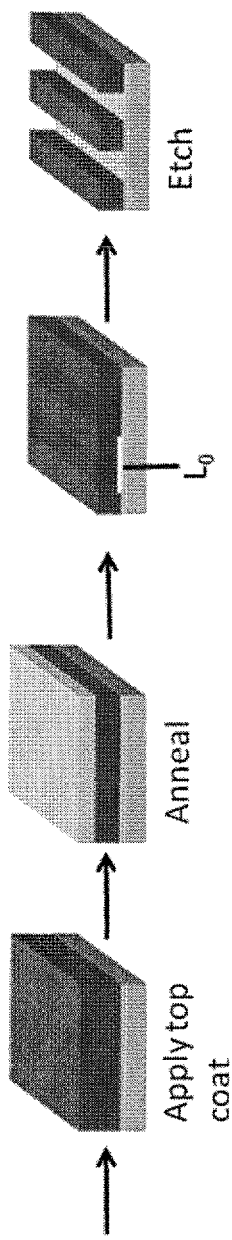
FIG. 4 shows a cartoon depicting the importance of a top coat and its importance regarding affecting orientation control during annealing.
Figure 5:
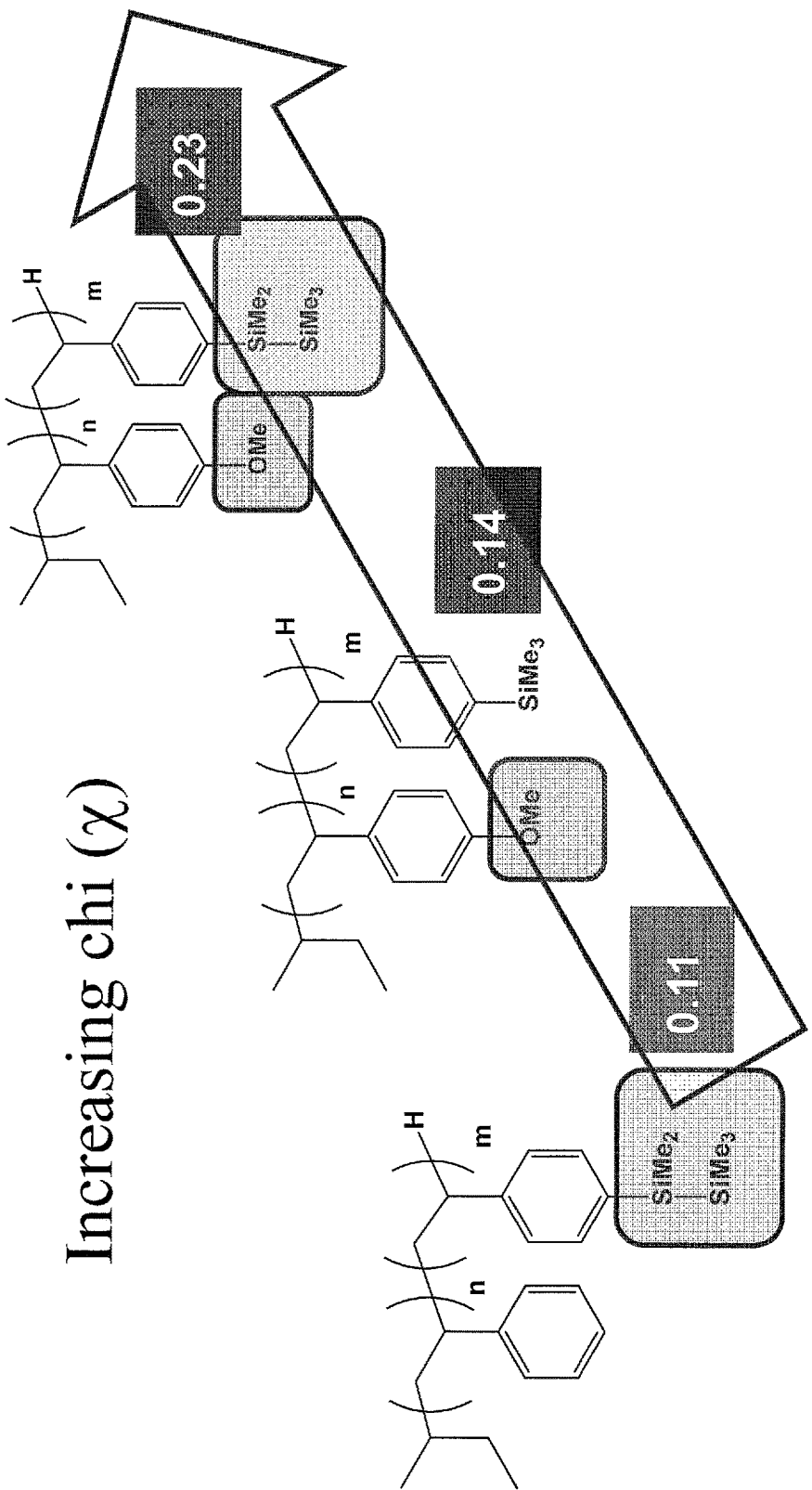
FIG. 5 shows that changing the block copolymer monomers changes the chi ($\chi$) value.

The material can form sub-10 nm features, but it does not spontaneously form domains with an orientation useful for lithography. Surface treatments for the top and bottom interfaces have been developed to control the orientation of block copolymer domains. Additionally, the block copolymer self-assembly needs to be directed in order to form nanostructures with long-range alignment. Well-established directed self-assembly strategies already exist, and this material should be amenable to those strategies. FIG. 4 shows a cartoon depicting the importance of a top coat and its importance regarding affecting orientation control during annealing. An important factor in determining whether a block copolymer will self assemble is the relative volume fraction of one of the blocks, the relative incompatibility of the monomer units, measured by the Flory-Huggins interaction parameter (Greek Symbol Chi $\chi$), and the degree of polymerization of the block copolymer (N) . Preferably, the volume fraction of one of the blocks is 30-70, 35-65, 40-60, more preferably 50-50 and the product of the degree of polymerization and the Flory-Huggins interaction parameter of the block copolymer is preferably greater than 10.5 and is more preferably greater than 25. It is believed that increasing the chi ($\chi$) value between the copolymer monomers enables the formation of smaller nanostructures. In one embodiment, increasing the chi ($\chi$) value is desirable. In one embodiment, a higher chi ($\chi$) value is required to access smaller structures FIG. 5 shows that changing the block copolymer monomers changes the chi value. One example of designing high chi ($\chi$) block copolymers for lithography is described by Durand, et al. (2015) J. Polym. Sci. A Polym. Chem. 53(2), 344-352 [3], hereby incorporated by reference.

Figure 6:
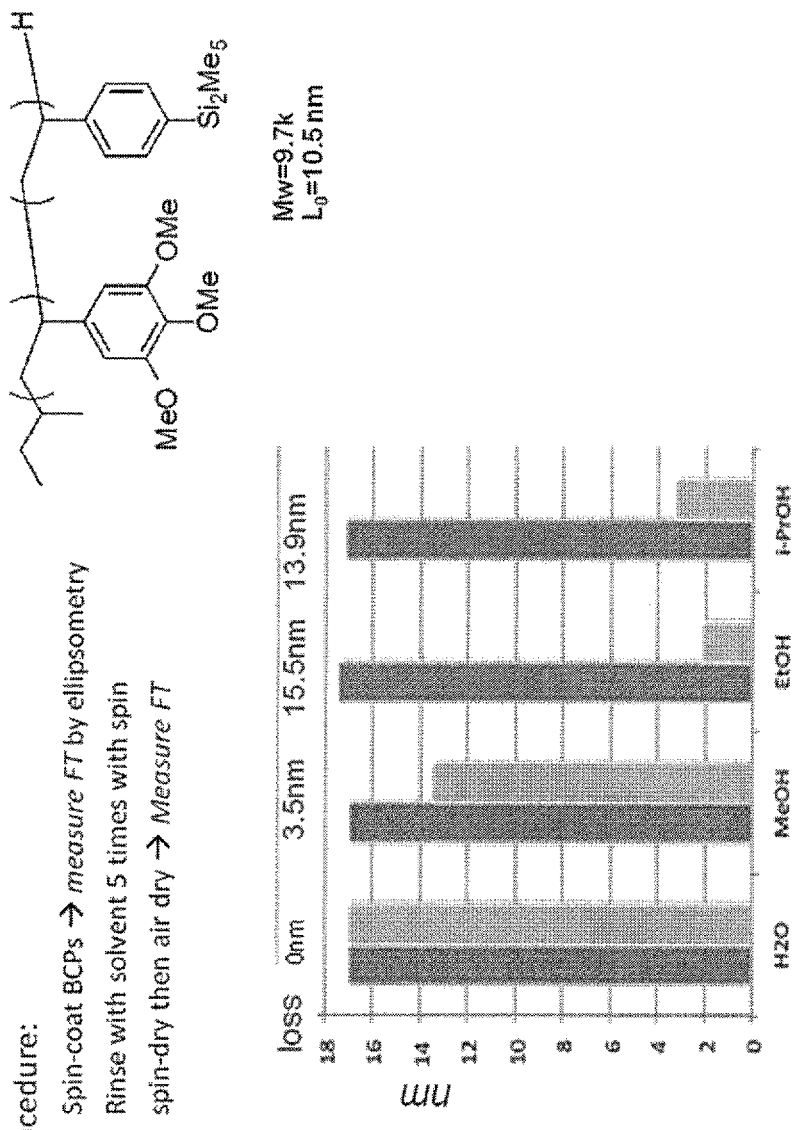
FIG. 6 shows how polar block solubility can prevent application of a topcoat as spin coating may dissolve the polar block as illustrated in the loss of block in the presence of polar solvents.

The composition of the block copolymers may significantly affect the susceptibility to exposure to solvents and the potential for spin coating of top coats. FIG. 6 shows how polar block solubility can prevent application of a topcoat as spin coating may dissolve the polar block as illustrated in the loss of block in the presence of polar solvents. In one embodiment, the surface of said substrate is treated to be neutral or near neutral prior to the coating step. Formation of perpendicular domains in BCP thin films requires non-preferential wetting of both blocks at the substrate and free surfaces. A seminal paper by Mansky et al. demonstrated a universal approach to creating such "neutral" interfaces with random copolymers derived from the constituents of the BCP [4], incorporated herein by reference. Neutral surface effects are reported by Kim et al. 2013 ACSNano 7(11), 9905-9919 [5] for two high-$\chi$ BCPs that are important because they can access significantly smaller feature sizes than poly(styrene-block-methyl methacrylate) (PS-PMMA). In one embodiment, neutral or near neutral prior to the coating step surface treatments before the coating step enables the formation of sub-10 nm structures.

Figure 8:
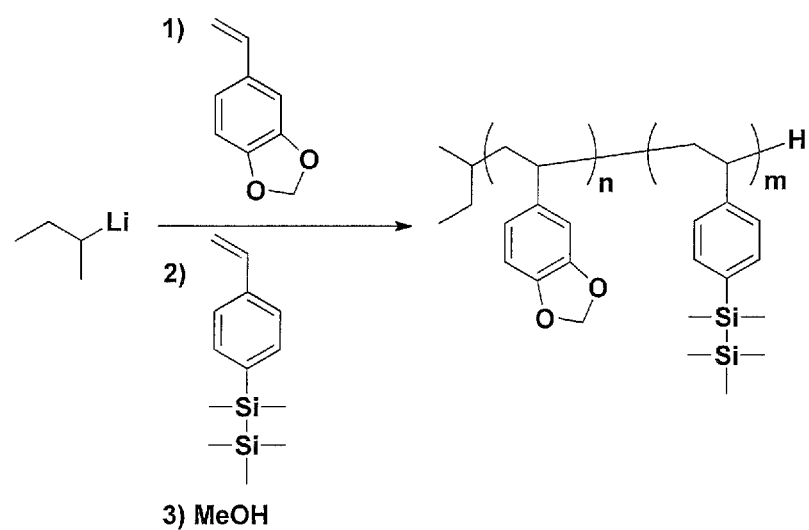
FIG. 8 shows the synthesis of Poly(5-vinylbenzo[d][1,3]dioxole-block-4-pentamethyldisilylstyrene).
Figure 9:
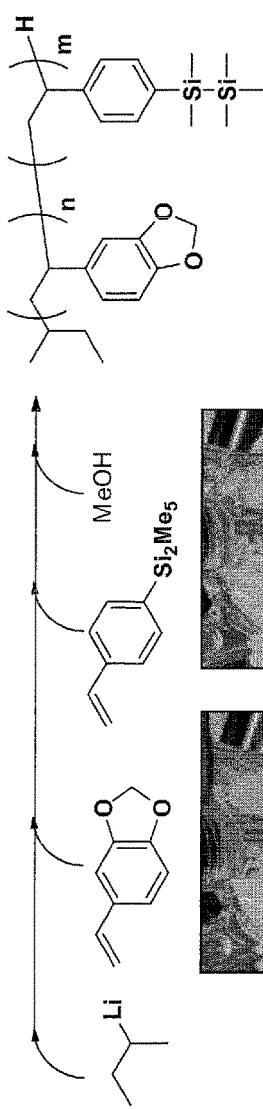
FIG. 9 shows a synthetic scheme of a block copolymer.
Figure 9:
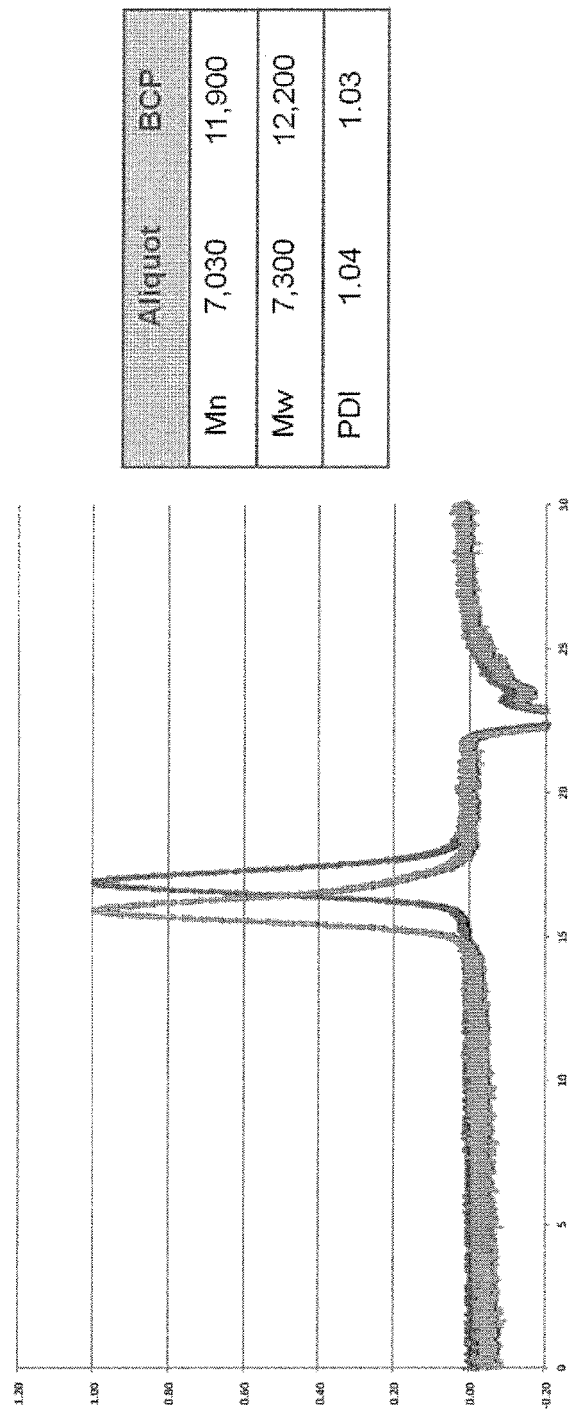
Figure 10:
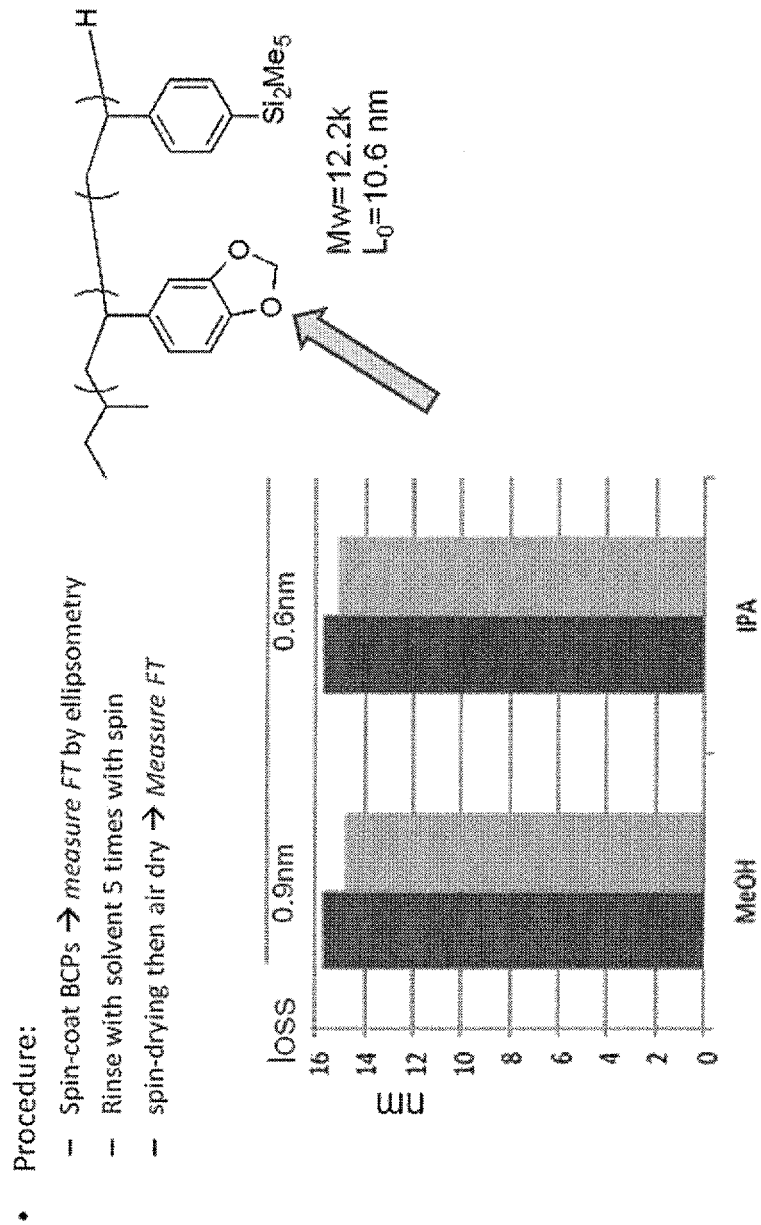
FIG. 10 shows the poly(5-vinylbenzo[d][1,3]dioxole-block-4-pentamethyl-disilylstyrene) block copolymer is resistant to polar solvent exposure loss.

A block copolymer composition that is resistant to solvents may allow for greater depth for features to develop, particularly in the annealing process. An example, FIG. 9 shows a synthetic scheme of a block copolymer Poly(5-vinylbenzo[d][1,3]dioxole-block-4-pentamethyldisilylstyrene), also shown in FIG. 8. FIG. 10 shows the poly(5- vinylbenzo[d][1,3]dioxole-block-4-pentamethyldisilylstyrene) block copolymer is resistant to polar solvent exposure loss.

Figure 11:
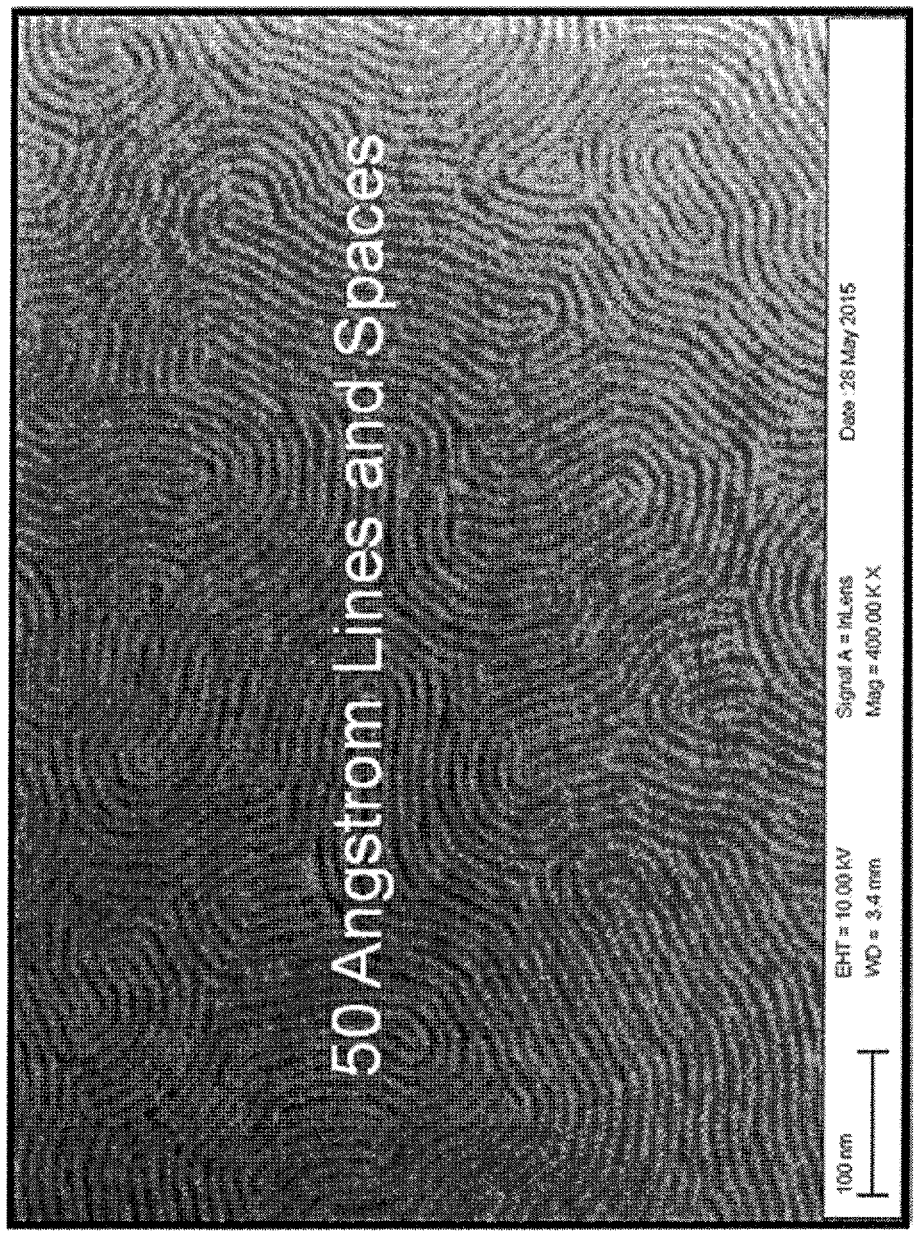
FIG. 11 shows 50 angstrom lines and spaces in the block copolymer. This meets Seagate requirements for bit patterned media.
Figure 12:
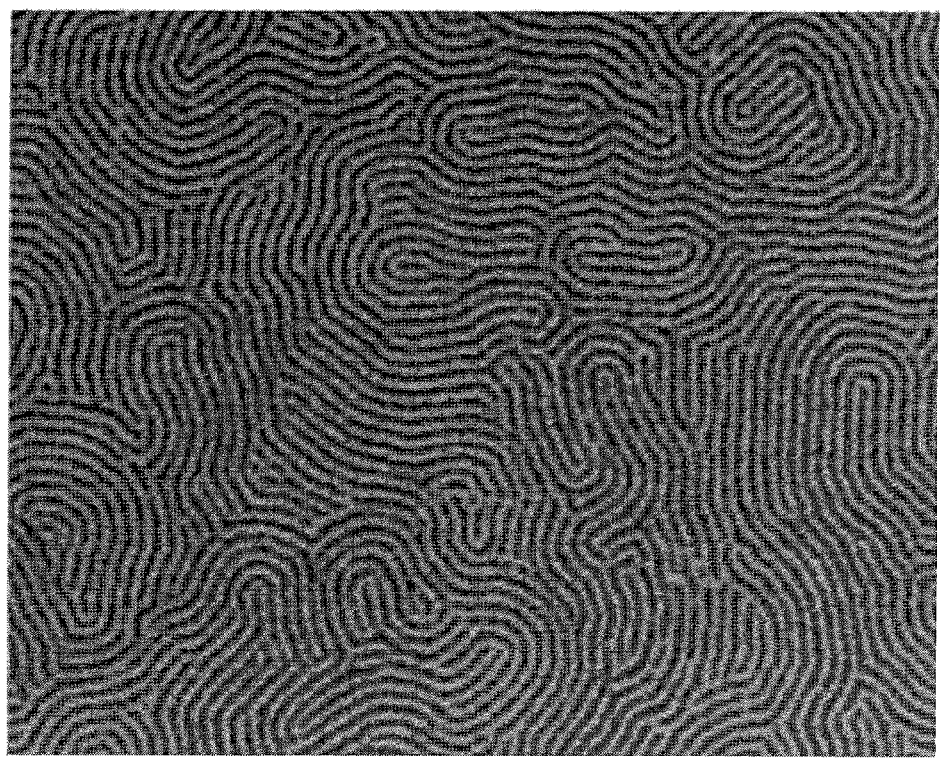
FIG. 12 shows perpendicularly oriented lamellae after etching. Alignment Control —directed self assembly (DSA) as described by Nealey, Russell, Ross, et al [1, 2].
Figure 13:
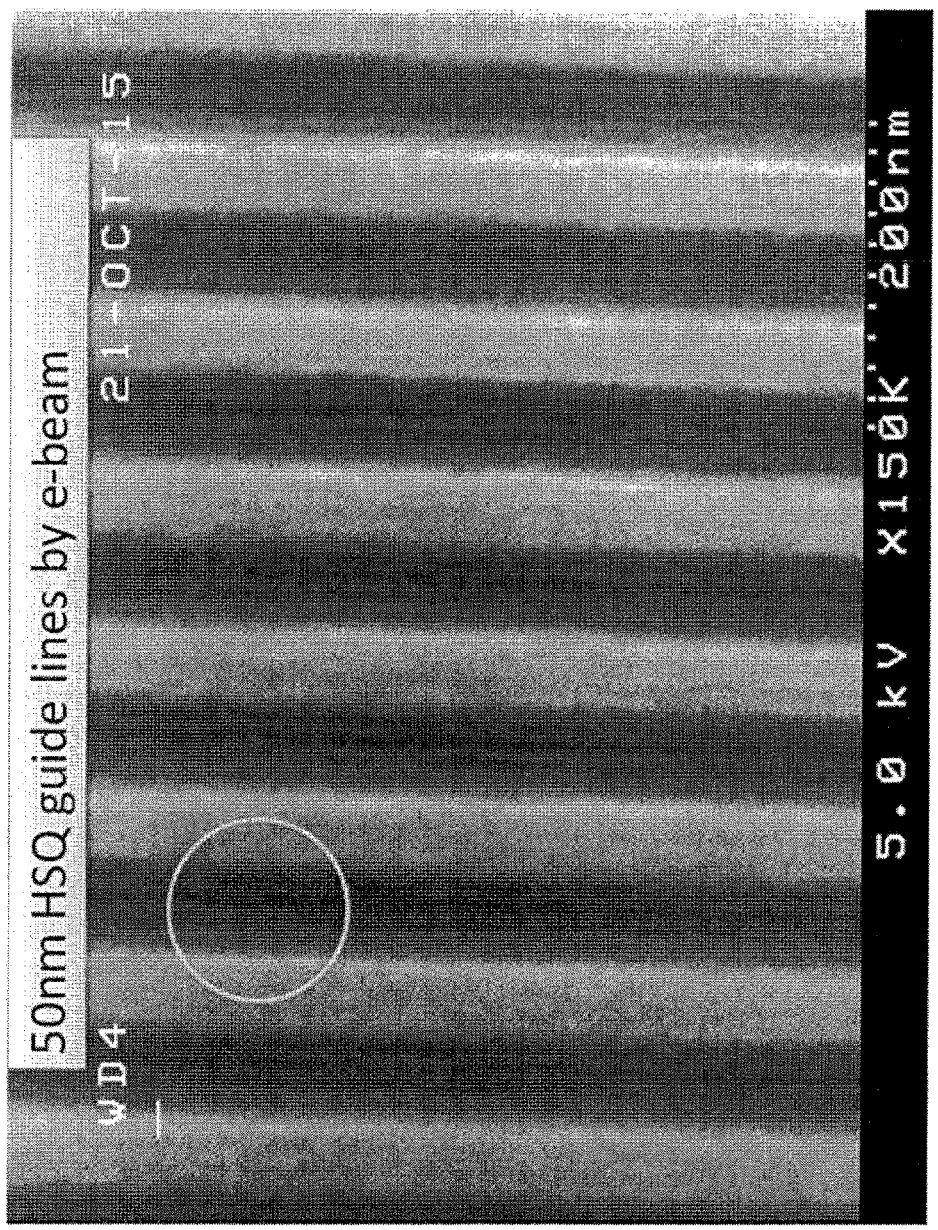
FIG. 13 shows graphoepitaxy alignment at 50 Angstroms.
Figure 14:
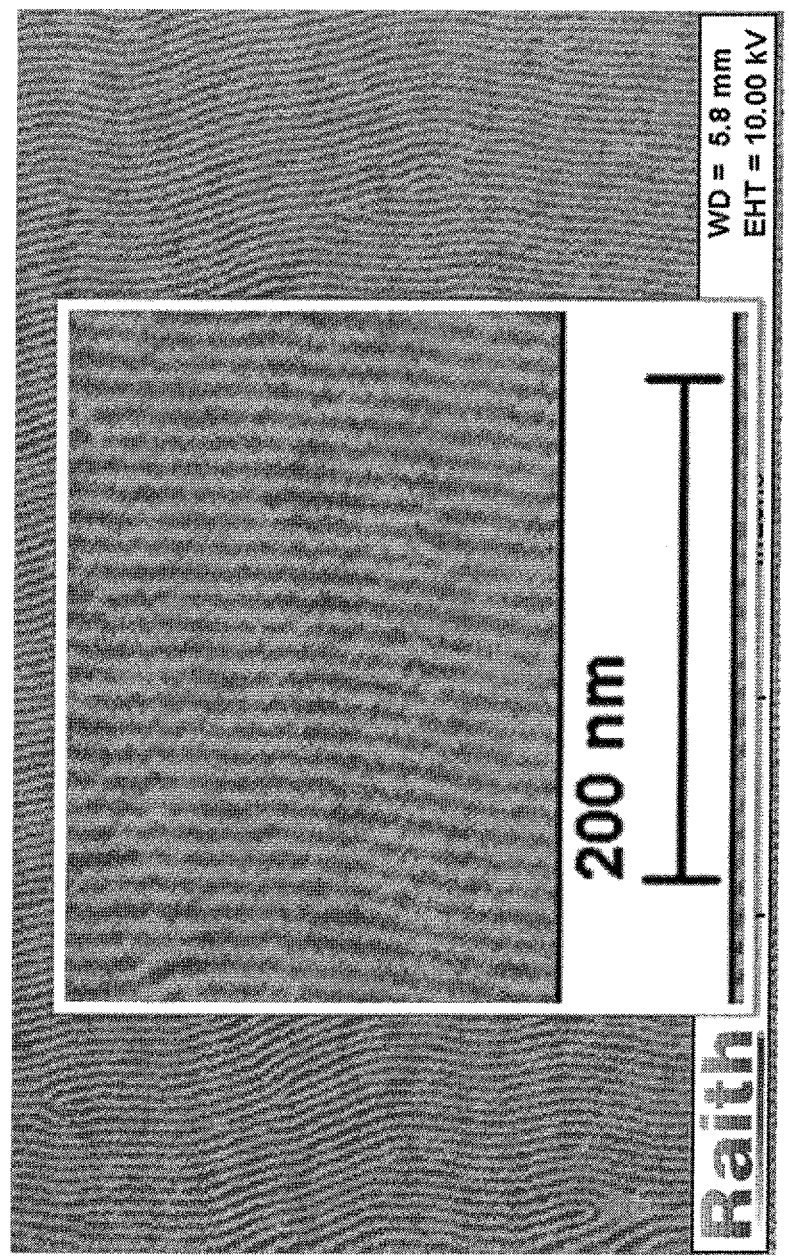
FIG. 14 shows a thicker block copolymer coating guides perpendicular.

Sub 10 nm features may be etched in this new block copolymer. FIG. 11 shows 50 angstrom lines and spaces in the block copolymer. This meets Seagate requirements for bit patterned media. FIG. 12 shows perpendicularly oriented lamellae after etching. Alignment Control—directed self assembly (DSA) as described by Nealey, Russell, Ross, et al [1, 2]. FIG. 13 shows graphoepitaxy alignment at 50 Angstroms. FIG. 14 shows a thicker block copolymer coating guides perpendicular.

BCP Systems

Figure 1:
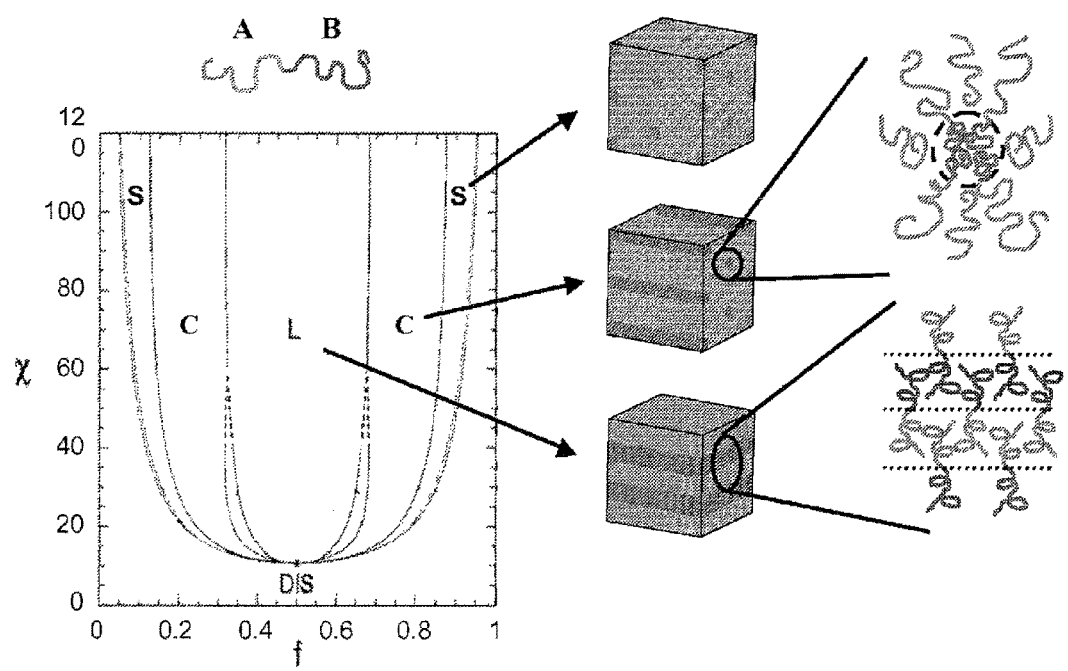
FIG. 1 shows a graph of an example of $\chi N$ as a function of the volume fraction, f, of a block (A) in a diblock (A-b-B) copolymer.
Figure 2:
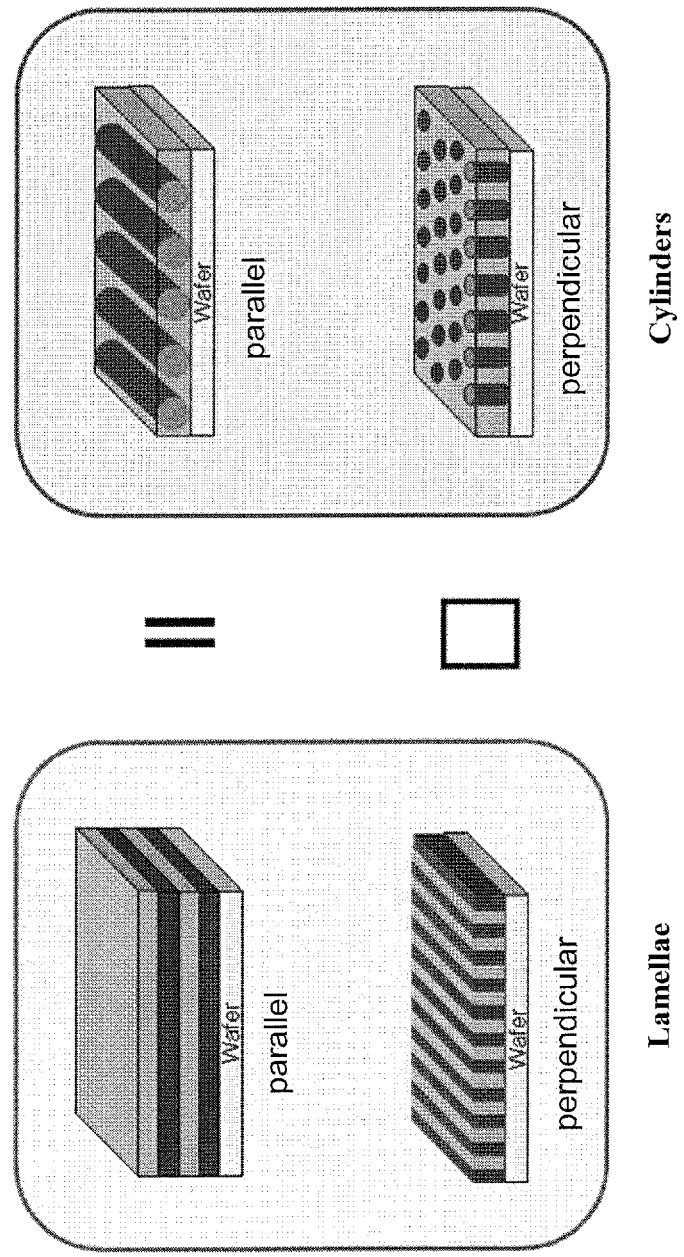
FIG. 2 shows various types of orientation control of the block copolymers, including parallel and perpendicular cylinders and lamellae.
Figure 3:
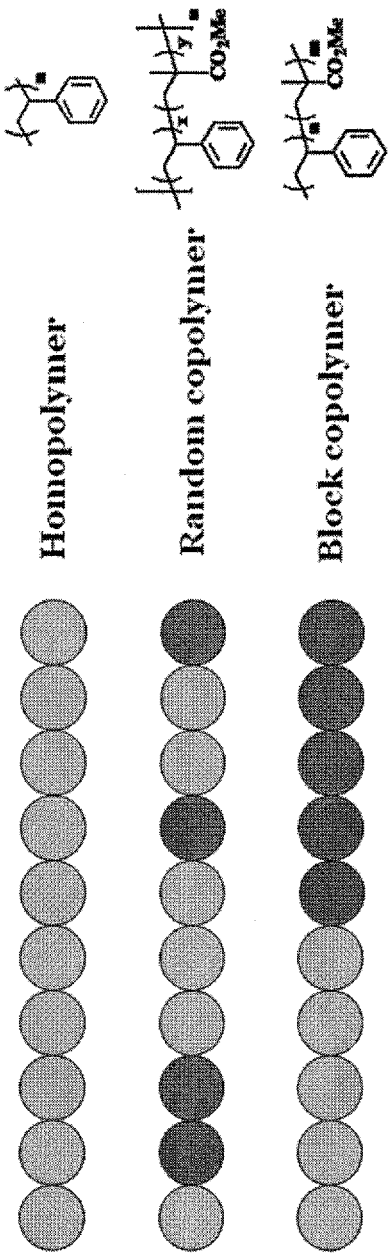
FIG. 3 is a schematic that shows the difference between homopolymers, random polymers and block polymers.

Block copolymers (BCPs) are a class of polymers synthesized from two or more polymeric blocks. The structure of diblock copolymer A-b-B may correspond, for example, to AAAAAAA-BBBBBBBB. The interaction parameter $\chi$ of a BCP is related to the energy of mixing the blocks in a block copolymer and is inversely proportional to temperature. The graph in FIG. 1 shows an example of $\chi N$ (where N is the degree of polymerization) as a function of the volume fraction, f, of a block (A) in a diblock (A-b-B) copolymer. FIG. 1 shows that at a particular temperature and volume fraction of A, the diblock copolymers microphase separate into domains of different morphological features. In the example of FIG. 1, when the volume fraction of either block is around 0.1, the block copolymer will microphase separate into spherical domains (S), where one block of the copolymer surrounds spheres of the other block. As the volume fraction of either block nears around 0.2-0.3, the blocks separate to form a hexagonal array of cylinders (C), where one block of the copolymer surrounds cylinders of the other block. And when the volume fractions of the blocks are approximately equal, lamellar domains (L) or alternating stripes of the blocks are formed. Representations of the cylindrical and lamellar domains at a molecular level are also shown. The phase behavior of block copolymers containing more than two types of blocks (e.g., A-b-B-b-C) also results in microphase separation into different domains. The self-assembly of block copolymer materials in bulk and the translation of ordered block copolymer domains into thin-films has emerged as a powerful approach to create functional nanostructures and templates for various applications, some examples of which are described in U.S. patent application Ser. No. 13/560,016 [6] and U.S. patent application Ser. No. 14/048,766 [7] incorporated herein by reference.

In some embodiments, the BCP systems that have at least one block that is not a pure component block are provided. Block copolymers having pure component blocks can be represented as A-b-B diblock copolymers, A-b-B-b-C triblock copolymers, and so on for higher order multiblock systems. For example, for a diblock copolymer systems, the chemical composition of the base molecule can be represented as A-A-A-A-A-A-A-A-A-B-B-B-B-B-B-B-B-B, with A and B each representing a different type of repeat unit or monomer polymerized into the polymer chain. For triblock copolymer systems, the chemical composition of the base molecule could be represented as: A-A-A-A-A-A-A-A-A-B-B-B-B-B-B-B-B-B-A-A-A-A-A-A-A-A-A-A or A-A-A-A-A-A-A-A-A-A-B-B-B-B-B-B-B-B-B-C-C-C-C-C-C-C-C-C, with A, B, and C each representing a different type of repeat unit or monomer. In these examples, A, B and C are pure component blocks. Examples of A-B diblock copolymer systems include:

| A repeat unit or monomer | B repeat unit or monomer | Block Copolymer |
|---|---|---|
| styrene | Methymethacrylate | PS-PMMA |
| styrene | ethylene oxide | PS-PEO |
| styrene | Dimethylsiloxane | PS-PDMS |

In the examples given above, A, B and C are pure component blocks, each having only one type of repeat unit or monomer. In some embodiments, BCPs are provided that have random or statistical copolymers as blocks rather than pure component blocks. One example is to use a random copolymer as one block in a diblock copolymer system: A-A-A-A-A-A-A-A-A-A-B-C-C-B-C-B-B-C-B-C. In this example, A is a pure component block, but the second block is a random copolymer of B and C, which can be denoted B-r-C or B-ran-C. Other examples are given below:

| First Block |
|---|
| A-C-A-A-C-C-A-C-C-C |
| (A-r-C) |
| A-D-A-A-D-D-A-D-D-D |
| (A-r-D) |

| Second Block |
|---|
| B-C-C-B-C-B-B-C-B-C |
| (B-r-C) |
| B-C-C-B-C-B-B-C-B-C |
| (B-r-C) |

| Block Copolymer |
|---|
| P(A-r-C)-P(B-r-C) |
| P(A-r-D)-P(B-r-C) |

Triblock and higher order multiblock copolymers having at least one block that is not a pure component block are also provided herein. The examples given above are mere examples and are non-limiting. For example, a copolymer sequence in a block is not necessarily strictly random in some embodiments. A copolymer sequence is not limited by a particular degree of polydispersity or randomness. The block copolymer system can be any block copolymer system that undergoes micro-phase separation, self-assembly, or order-disorder processes, and can be used as a material for directed assembly. In some embodiments, a constituent C of a B-C copolymer is a B monomer or repeat unit that is modified with a functional group, X.

General Materials and Methods

Materials. Some reagents were purchased from Sigma-Aldrich Chemical Co. and used without further purification unless otherwise noted. THF was purchased from JT Baker. 100 mm silicon wafers were purchased from Silicon Quest International.

Instrumentation. All $^1$H and $^{13}$C NMR spectra were recorded on a Varian Unity Plus 400 MHz instrument. All chemical shifts are reported in ppm downfield from TMS using the residual protonated solvent as an internal standard (CDCl$_3$, $^1$H 7.26 ppm and $^{13}$C 77.0 ppm). Molecular weight and polydispersity data were measured using an Agilent 1100 Series Isopump and Autosampler and a Viscotek Model 302 TETRA Detector Platform with 3 I-series Mixed Bed High MW columns against polystyrene standards. Polymer solutions were filtered with 0.20 μm PTFE filters prior to spin coating. Films were spin coated and baked on a Brewer CEE 100CB Spincoater & Hotplate. Film thicknesses were determined with a J.A. Woollam Co, Inc. VB 400 VASE Ellipsometer using wavelengths from 382 to 984 nm with a 70° angle of incidence. Contact angles were measured with a Ramé-Hart, inc. NRL C.A. Goniometer (Model #100-00). A Heraeus Vacutherm Type VT 6060 P from Kendro was used to thermally anneal the films under reduced pressure. A Digital Instruments Dimension 3100 atomic force microscope with NCHR Pointprobe® Non-Contact Mode tips with a force constant of 42 N/m was used to collect AFM images.

Description of Illustrative Embodiments

There are many ways to make the monomer and block copolymer. The following is a non-limiting example of how the monomer and block copolymer can be synthesized, all of which are well-known to those skilled in the art. It is not intended that the present invention be limited to specific block polymers. However, to illustrate the invention, examples of various copolymers are provided. In one embodiment, the invention relates to the synthesis of the block copolymer Poly(5-vinyl-benzo[d][1,3]dioxol-block-4-pentamethyldisilylstyrene).

EXAMPLE 1

Synthesis of 5-vinylbenzo[d][1,3]dioxole

Figure 7:
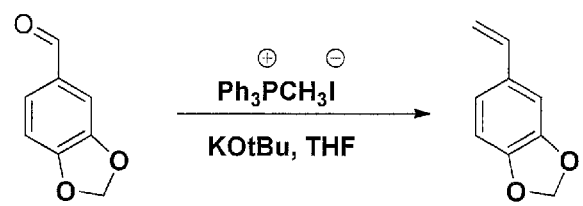
FIG. 7 is a schematic showing one embodiment of a synthesis scheme for 5-vinylbenzo[d][1,3]dioxole.

The synthetic scheme described below is found in FIG. 7. A 1 L round bottom flask was equipped with a stir bar and flame dried. Triphenylphosphonium iodide (119.0 g, 293.1 mmol, 1.1 eq) and dry THF (300 mL) was added under nitrogen. The slurry was cooled to 0° C. in an ice bath. Potassium tert-butoxide (32.9 g, 293.1 mmol, 1.1 eq) was added under nitrogen portionwise. The white slurry turned bright yellow. Piperonal (40.0 g) was dissolved in 100 mL of dry THF and added slowly via syringe needle. After 5 minutes, the slurry became white. After 1.5 hr, TLC showed that there was still unconsumed piperonal. An additional 10.7 g of triphenylphosphonium iodide and 3.0 g of tert-butoxide was added the reaction vessel. The reaction was stirred for an additional 3.5 hrs. TLC showed that that the piperonal was completely consumed. The reaction was quenched with 5 mL of water. The solids were filtered off, and the solvent was removed via rotary evaporation. The crude product was passed through a plug of silica using 1:9 ethyl acetate:hexanes as the eluting solvent. The solvent was removed using rotary evaporation and the product was dried in vacuo. The monomer was distilled (BP: 46-49° C. at 27 mTorr) prior to anionic polymerization to yield 33.9 g (86% yield) as colorless oil. $^1$H-NMR (400 MHz; CDCl$_3$): δ 6.97 (d, J=1.7 Hz, 1H), 6.85-6.83 (m, 1H), 6.77 (d, J=8.0 Hz, 1H), 6.63 (dd, J=17.5, 10.8 Hz, 1H), 5.96-5.95 (m, 2H), 5.58 (dd, J=17.5, 0.8 Hz, 1H), 5.14 (dd, J=10.8, 0.8 Hz, 1H). $^{13}$C-NMR (400 MHz; CDCl$_3$): δ 147.9, 147.3, 136.3, 132.1, 121.1, 111.9, 108.2, 105.4, 101.0. HRMS (CI) m/z for [M]$^+$calcd for C$_9$H$_8$O$_2$ 148.0524; found 148.0521.

EXAMPLE 2

Poly(5-vinylbenzo[d][1,3]dioxole-block-4-pentamethyldisilylstyrene)

The synthetic schematic described below is found in FIG. 8. The monomers (5-vinylbenzo[d][1,3]dioxole and 4-pentamethyldisilylstyrene) were dried by distillation over dibutylmagnesium to exclude air and water prior to their use in the polymerization. A 500 mL glass reactor, charged with a stir bar, was flame-dried under high vacuum and purged with argon gas (5x). Attached to the ports were a glass thermocouple well, a solvent flask, two glass blanks, and a glass arm with inlets to the Schlenk line, pressure gauge, and rubber septum. Purified tetrahydrofuran (135 g) from an air and water free solvent delivery system was added. The solvent was magnetically stirred, and the reactor was cooled to −77° C. with a dry ice/IPA bath while maintaining a 3 psig overpressure of argon in the reactor. sec-Butyllithium (0.642 mL of a 1.4 M solution in hexanes, 0.89 mmol) was then added via syringe. One hour later, 5-vinylbenzo[d][1,3] dioxole (4 g, 26.9 mmol) was added via syringe. After 3.5 hours, 4-pentamethyldisilylstyrene (3.19 g, 13.6 mmol) was added via syringe. The reaction was run for one additional hour and terminated with degassed methanol. The solution was precipitated into methanol and the resultant white powder was dried in vacuo. The total recovered mass was 6.9 g.

Thus, specific compositions and methods of block copolymers for sub-10 nm patterning have been disclosed. It should be apparent, however, to those skilled in the art that many more modifications besides those already described are possible without departing from the inventive concepts herein. Moreover, in interpreting the disclosure, all terms should be interpreted in the broadest possible manner consistent with the context. In particular, the terms "comprises" and "comprising" should be interpreted as referring to elements, components, or steps in a non-exclusive manner, indicating that the referenced elements, components, or steps may be present, or utilized, or combined with other elements, components, or steps that are not expressly referenced.

Although the invention has been described with reference to these preferred embodiments, other embodiments can achieve the same results. Variations and modifications of the present invention will be obvious to those skilled in the art and it is intended to cover in the appended claims all such modifications and equivalents. The entire disclosures of all applications, patents, and publications cited above, and of the corresponding application are hereby incorporated by reference.

REFERENCES

1. Gronheid, R. and Nealey, P., (Eds.) (2015) *Directed Self-Assembly of Block Co-Polymers for Nano-Manufacturing*, Woodhead Publishing.
2. Seidel, R. et al. (2015) "6—Directed Self-Oriented Self-Assembly of Block Copolymers Using Chemically Modified Surfaces," in *Directed Self-Assembly of Block Co-Polymers for Nano-Manufacturing* (Gronheid, R. and Nealey, P., Eds.), pp 129-170, Woodhead Publishing.
3. Durand, W. J. et al. (2015) "Design of High-X Block Copolymers for Lithography," *J. Polym. Sci. A Polym. Chem.* 53(2), 344-352.
4. Mansky, P. et al. (1997) "Controlling Polymer-Surface Interactions with Random Copolymer Brushes," *Science* 275(7), 1454-1457.
5. Kim, S. et al. (2013) "Consequences of Surface Neutralization in Diblock Copolymer Thin Films," *ACS Nano* 7(11), 9905-9919.
6. Nealey, P. F. et al. "Block Copolymer Materials for Directed Assembly of Thin Films," United States Patent Application Publication Number US 2013-0029113 A1, application Ser. No. 13/560,016, filed Jul. 27, 2012. (published Jan. 31, 2013).
7. Gopalan, P. et al. "Block Copolymers with High Flory-Huggins Interaction Parameters for Block Copolymer Lithography," United States Patent Application Publication Number US 2015-0099109 A1, application Ser. No. 14/048,766, filed Oct. 8, 2013. (published Apr. 9, 2015).

The invention claimed is:

1. A block copolymer comprising 5-vinylbenzo [d][1,3]dioxole, wherein said block copolymer is part of a layered structure.

2. The block copolymer of claim 1, wherein said block copolymer further comprises a silicon-containing block.

3. The block copolymer of claim 2, wherein said block copolymer further comprises pentamethyldisilylstyrene.

4. The block copolymer of claim 3, wherein said block copolymer is poly(5-vinylbenzo[d][1,3]dioxole)-b-poly(pentamethyldisilylstyrene).

5. Sub-10 nm nanostructures comprising a block copolymer comprising 5-vinylbenzo[d][1,3]dioxole.

6. A method to achieve sub-10 nm nanostructures, comprising a) coating a block copolymer film on a substrate, said block copolymer comprising 5-vinylbenzo [d][1,3]dioxole; b) applying a top coat on top of the block copolymer, and c) annealing under conditions such that sub-10 nm nanostructures form.

7. The method of claim 6, wherein the surface of said substrate is treated to be neutral or near neutral prior to said coating of step a).

8. The method of claim 6, wherein said nanostructures are lamella nanostructures.

9. The method of claim 6, wherein said nanostructures are cylindrical nanostructures.

10. The method of claim 6, further comprising d) etching said layered structure to remove the top coat and part of the block copolymer revealing said nanostructures.

11. A method of creating a layered structure, comprising: a) providing a surface, a surface treatment layer, a block copolymer comprising 5-vinylbenzo [d][1,3]dioxole, and a top coat composition; b) treating said surface with said surface treatment layer to create a first layer on said surface; c) coating said first layer with block copolymer to create a second layer on said surface comprising a block copolymer film; and d) coating said second layer with said top coat composition so as to create a third layer on said surface, said third layer comprising a top coat on said block copolymer film surface, said first, second and third layers comprising a layered structure.

* * * * *